(12) United States Patent
Takahashi et al.

(10) Patent No.: US 8,232,355 B2
(45) Date of Patent: Jul. 31, 2012

(54) LIQUID RESIN COMPOSITION FOR ELECTRONIC COMPONENTS AND ELECTRONIC COMPONENT DEVICE

(75) Inventors: Hisato Takahashi, Chikusei (JP); Hisashi Tsukahara, Koga (JP); Kyouichi Tomita, Chikusei (JP); Shinsuke Hagiwara, Chikusei (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/094,838

(22) PCT Filed: Nov. 24, 2006

(86) PCT No.: PCT/JP2006/323409
§ 371 (c)(1),
(2), (4) Date: May 23, 2008

(87) PCT Pub. No.: WO2007/061037
PCT Pub. Date: May 31, 2007

(65) Prior Publication Data
US 2009/0286930 A1    Nov. 19, 2009

(30) Foreign Application Priority Data
Nov. 25, 2005  (JP) .................... P2005-340201

(51) Int. Cl.
C08F 283/12 (2006.01)
C08F 283/10 (2006.01)
C08G 77/38 (2006.01)
C08G 77/04 (2006.01)
C08L 63/00 (2006.01)
C08L 83/02 (2006.01)

(52) U.S. Cl. ........ 525/476; 524/612; 257/791; 257/793; 523/466; 523/467; 525/533; 525/477

(58) Field of Classification Search .................. 524/100, 524/612; 174/260; 525/533, 476, 477; 257/791, 257/793; 523/466, 467
See application file for complete search history.

(56) References Cited

U.S. PATENT DOCUMENTS

| | | | |
|---|---|---|---|
| 5,919,844 A | 7/1999 | Shimizu et al. | |
| 6,492,438 B1 * | 12/2002 | Nomura | 523/466 |
| 6,613,449 B2 | 9/2003 | Yamaguchi et al. | |
| 6,674,016 B2 * | 1/2004 | Kubo et al. | 174/260 |
| 6,833,180 B1 * | 12/2004 | Kodemura | 428/220 |
| 2002/0043728 A1 | 4/2002 | Harada | |
| 2004/0067366 A1 | 4/2004 | Gorczyca | |
| 2006/0142438 A1 * | 6/2006 | Ishii et al. | 524/100 |
| 2006/0142507 A1 * | 6/2006 | Hirata et al. | 525/524 |
| 2007/0185243 A1 * | 8/2007 | Terada et al. | 523/457 |
| 2007/0254986 A1 * | 11/2007 | Tendou et al. | 523/440 |

FOREIGN PATENT DOCUMENTS

| | | |
|---|---|---|
| CN | 1182447 | 5/1998 |
| CN | 1340586 | 3/2002 |
| CN | 1534074 | 10/2004 |
| CN | 1670106 | 9/2005 |
| JP | 61-019625 | 1/1986 |
| JP | 63-146917 | 6/1988 |
| JP | 02-294354 | 12/1990 |
| JP | 2000-198831 | 7/2000 |
| JP | 2002-097257 | 4/2002 |
| JP | 2002-097270 | 4/2002 |
| JP | 2002-173519 | 6/2002 |
| JP | 2002-194066 | 7/2002 |
| JP | 2002-302534 | 10/2002 |
| JP | 2003-073453 | 3/2003 |
| JP | 2003-105174 | 4/2003 |
| JP | 2003-183351 | 7/2003 |
| JP | 2003-183480 | 7/2003 |
| JP | 2004-010810 | 1/2004 |
| JP | 2004-189815 | 7/2004 |
| JP | 2005-225980 | 8/2005 |
| JP | 2005-232195 | 9/2005 |
| JP | 2005-298613 | 10/2005 |
| KR | 2002-0063513 | 8/2002 |
| TW | 565880 | 12/2003 |

OTHER PUBLICATIONS

Taiwanese Official Action issued Oct. 6, 2010, for TW Application No. 095143575.
Chinese Official Action issued Oct. 13, 2010, for CN Application No. 200680043680.9.
Korean Official Action dated Nov. 26, 2009, for Application No. 10-2008-7015350.
Taiwanese Official Action issued on Feb. 3, 2010, for Application No. 095143575.
Chinese Official Action issued Apr. 7, 2010, for Application No. 200680043680.9.
Japanese Official Action issued May 25, 2010, for Application No. 2007-513502.
Korean Official Action issued Jul. 23, 2010, for KR Application No. 10-2008-7015350.
Japanese Official Action issued Oct. 5, 2010, for Application No. 2007-513502.

* cited by examiner

*Primary Examiner* — James J Seidleck
*Assistant Examiner* — Deve E Valdez
(74) *Attorney, Agent, or Firm* — Antonelli, Terry, Stout & Kraus, LLP.

(57) ABSTRACT

The present invention provides a liquid resin composition for electronic components, which is excellent in migration resistance and also superior in formability and reliability, as well as an electronic component device sealed therewith, and relates to a liquid resin composition for electronic components, which comprises (A) an epoxy resin, (B) a cyclic acid anhydride which is liquid at ordinary temperature and has an acid anhydride equivalent of 200 or more, and (C) a coupling agent.

24 Claims, No Drawings

LIQUID RESIN COMPOSITION FOR ELECTRONIC COMPONENTS AND ELECTRONIC COMPONENT DEVICE

TECHNICAL FIELD

The present invention relates to a liquid resin composition for electronic components, which is suitable for sealing electronic components, and an electronic component device sealed therewith.

BACKGROUND ART

Conventionally, resin sealing has prevailed in the field of element sealing for electronic component devices such as transistors, IC etc., from the viewpoint of productivity, costs, etc., and epoxy resin compositions are widely used. This is because the epoxy resin is well-balanced in characteristics such as workability, formability, electrical characteristics, moisture resistance, heat resistance, mechanical characteristics, adhesiveness to an insert material, etc. In semiconductor devices having bare chips mounted thereon, such as COB (Chip on Board), COG (Chip on Glass), TCP (Tape Carrier Package) etc., liquid resin compositions for electronic components are widely used as sealing materials. In a semiconductor device (flip chip) having a semiconductor element bump-bonded directly onto an interconnection substrate, a liquid resin composition for electronic components is used as an underfill agent.

The semiconductor device has narrow wiring width and a narrow pitch between wirings, and some of the state-of-the-art flip chip semiconductor devices have a pitch width of 50 μm or less. A voltage is applied across narrowly pitched electrodes of these semiconductor devices, and ion migration becomes a major issue. Particularly at high temperature under high humidity, migration easily occurs to cause defects in the semiconductor device. As a typical semiconductor device with thinner wirings and narrower pitches, there is COF (Chip on Film), and particularly migration resistance has become important in the field of COF. Conventionally, it is known that reduction of impurities in liquid resin compositions for electronic components is effective in improving migration, but it has become impossible to improve migration by merely attaining higher purity.

Curing of a liquid sealing epoxy resin composition needs heating at high temperature for a long time, and in recent years, there is an increasing demand for rapid-curing liquid sealing epoxy resin compositions aimed at improving productivity. For example, a liquid sealing epoxy resin composition comprising (A) an epoxy resin and (B) a curing agent as essential components, wherein the curing agent (B) comprises an allyl group-containing phenol resin, and the surface of the composition after curing has a reflectance of 10% or less (see JP-A 2002-194066).

DISCLOSURE OF THE INVENTION

The present invention was made in light of such circumstances, and the object of the present invention is to provide a liquid resin composition for electronic components, which is excellent in migration resistance and also superior in formability and reliability, as well as an electronic component device sealed therewith.

The present inventors made extensive study for solving the problem, and as a result, they found that the object can be solved by applying a liquid resin composition for electronic components which improves the adhesiveness between an electronic component such as a semiconductor element and an interconnection substrate and has low water absorption, and the present invention was thereby completed.

The present invention relates to the following (1) to (8):
(1) A liquid resin composition for electronic components, which comprises (A) an epoxy resin, (B) a cyclic acid anhydride which is liquid at ordinary temperature and has an acid anhydride equivalent of 200 or more, and (C) a coupling agent.
(2) The liquid resin composition for electronic components according to the above-mentioned (1), further comprising an inorganic filler wherein the amount of the inorganic filler compounded is 10% by mass or less.
(3) The liquid resin composition for electronic components according to the above-mentioned (1) or (2), which further comprises rubber particles.
(4) The liquid resin composition for electronic components according to any one of the above-mentioned (1) to (3), which further comprises a silicone-modified epoxy resin.
(5) The liquid resin composition for electronic components according to anyone of the above-mentioned (1) to (4), which further comprises an ion-trapping agent.
(6) The liquid resin composition for electronic components according to any one of the above-mentioned (1) to (5), which further comprises a latent curing accelerator for accelerating the reaction between (A) and (B).
(7) The liquid resin composition for electronic components according to anyone of the above-mentioned (1) to (6), which is used an electronic component device comprising an electronic component bump-bonded directly onto an interconnection substrate having a film as a base material.
(8) An electronic component device sealed with the liquid resin composition for electronic components according to any one of the above-mentioned (1) to (6).

The liquid resin composition for electronic components according to the present invention is a liquid resin composition for electronic components which is excellent in migration resistance and also superior in formability and reliability, and its industrial value is high. Particularly, the liquid resin composition of the present invention is useful as an underfill material for a semiconductor device wherein a semi conductor element is subjected via bump connection to flip-chip bonding to a wiring formed on a rigid and flexible circuit board or on a glass, specifically for a semiconductor device such as flip chip BGA and COF.

The disclosure of this application is related to the subject matter of Japanese Patent Application No. 2005-340201 filed Nov. 25, 2005, the disclosure of which is incorporated herein by reference.

BEST MODE FOR CARRYING OUT THE INVENTION

The epoxy resin (A) used in the present invention is not particularly limited as long as it is an epoxy resin having two or more epoxy groups in one molecule capable of curing, and the epoxy resin used generally in liquid resin compositions for electronic components can be used, and the epoxy resin used may be solid and/or liquid as long as the composition is liquid. Specific examples thereof include glycidyl ether type epoxy resins obtained by reacting epichlorohydrin with bisphenol A, bisphenol F, bisphenol AD, bisphenol S, naphthalene diol, hydrogenated bisphenol A etc.; novolac type epoxy resins such as an ortho-cresol novolac type epoxy resin, wherein novolac resins obtain by condensing or co-condensing phenols with aldehydes were epoxylated; glycidyl ester type epoxy resins obtained by reacting polybasic acids such as phthalic acid and dimer acid with epichlorohydrin; glycidyl amine type epoxy resins obtained by reacting polyamines such as diamino diphenylmethane and isocyanuric acid with epichlorohydrin; and linear aliphatic epoxy resins and alicyclic epoxy resins obtained by oxidizing olefin bonds with peracids such as peracetic acid. These may be used alone or as a mixture of two or more thereof.

From the viewpoint of lower viscosity, the liquid epoxy resin is preferable, and from the viewpoint of reactivity with a phenol resin, the bisphenol liquid epoxy resin is more preferable.

These epoxy resins are preferably sufficiently purified resins with fewer ionic impurities. For example, the resins wherein free Na ions and free Cl ions are 500 ppm or less are more preferable.

In the present invention, the cyclic acid anhydride (B) which is liquid at ordinary temperature and has an acid anhydride equivalent of 200 or more is not particularly limited, and examples include various cyclic acid anhydrides having a plurality of alkyl groups, such as trialkyl tetrahydrophthalic anhydride and dodecenyl succinic anhydride, which are obtained from, for example, maleic anhydride and a diene compound by Diels-Alder reaction.

The "cyclic acid anhydride" refers, as typified by phthalic anhydride, to a compound wherein two carbon atoms C in "—CO—O—CO—" are chemically bound to other two carbon atoms respectively to form a cycle. The "acid anhydride equivalent" is indicated as (molecular weight of an acid anhydride)/(number of acid anhydride groups in the acid anhydride molecule).

As such compound, jER Cure YH306 having an acid anhydride equivalent of 234 manufactured by Japan Epoxy Resins Co., Ltd., for example, is commercially available.

When the acid anhydride equivalent of the acid anhydride is less than 200, its cured product has increased ester linkage and thus easily undergoes the influence of hydrolysis at high temperature under high humidity, thus easily causing deterioration in humidity resistance, particularly in migration resistance. Further when the acid anhydride equivalent of the acid anhydride is less than 200, water absorption is increased due to the influence of ester groups, resulting in deterioration in migration resistance as well. That is, the cyclic acid anhydride having a high acid anhydride equivalent has a lower density of ester groups than in the cyclic acid anhydride having a low acid anhydride equivalent, so its cured product has lower water absorption, thus enabling a reduction in the amount of ionic impurities such as Cl eluted into water.

The acid anhydride equivalent is preferably 200 to 400, more preferably 200 to 300.

The structure of the cyclic acid anhydride as the component (B) is not particularly limited insofar as the acid anhydride equivalent there of is 200 or more, but from the viewpoint of migration resistance, preferably its molecule does not contain halogen atoms such as chlorine and bromine and ester linkages.

In the present invention, a curing agent other than the component (B) can be suitably used, and as the curing agent for the epoxy resin, generally used curing agents can be used. Examples thereof include acid anhydride compounds such as phthalic anhydride, maleic anhydride, methylhimic anhydride, himic anhydride, succinic anhydride, tetrahydrophthalic anhydride, hexahydrophthalic anhydride, chlorendic anhydride, methyltetrahydrophthalic anhydride, 3-methylhexahydrophthalic anhydride, 4-methylhexahydrophthalicanhydride, a trialkyltetrahydrophthalic anhydride/maleic acid adduct, methylhexahydrophthalic acid, methyltetrahydrophthalic anhydride, benzophenone tetracarboxylic anhydride, trimellitic anhydride, pyromellitic anhydride, methyltetrahydrophthalic anhydride, and hydrogenated methylnasic anhydride, amine compounds such as diethylene triamine, triethylene triamine, tetraethylene pentamine, m-xylene diamine, trimethyl hexamethylene diamine, 2-methyl pentamethylene diamine, diethyl aminopropyl amine, isophorone diamine, 1,3-bisaminomethyl cyclohexane, bis (4-aminocyclohexyl) methane, norbornene diamine, 1,2-diaminocyclohexane, Laromin, diaminodiphenyl methane, methaphenylene diamine, diaminodiphenyl sulfone, polyoxypropylene diamine, polyoxypropylene triamine, a polycyclohexyl polyamine mixture, and N-aminoethyl piperazine, imidazole compounds such as 2-ethyl-4-methyl imidazole, 2-phenyl imidazole, 1-(2-cyanoethyl)-2-ethyl-4-methyl imidazole, 2,4-diamino-6-(2-methylimidazoyl-(1))ethyl-s-triazine, 2-phenyl imidazoline, and 2,3-dihydro-1H-pyrrolo (1,2-a) benzimidazole, and tertiary amines, DBU, dicyandiamide, organic acid dihydrazide, and N,N-dimethyl urea derivatives. Among these, liquid acid anhydride compounds and amine compounds are preferable from the viewpoint of lower viscosity.

The amount of the component (B), that is, the cyclic acid anhydride which is liquid at ordinary temperature and has an acid anhydride equivalent of 200 or more, compounded is preferably 30% by mass or more, more preferably 40% by mass or more, still more preferably 60% by mass or more, based on the total amount of the curing agent containing the component (B), in order to exhibit its performance.

The equivalent ratio of the epoxy resin (A) to the total curing agent containing the component (B) that is the cyclic acid anhydride which is liquid at ordinary temperature and has an acid anhydride equivalent of 200 or more is not particularly limited, but for reducing their unreacted matter, the amount of the curing agent is established preferably in the range of 0.6 to 1.6 equivalents, more preferably 0.7 to 1.4 equivalents, still more preferably 0.8 to 1.2 equivalents, relative to the epoxy resin. When the amount of the curing agent is outside the range of 0.6 to 1.6 equivalents, the curing reaction tends to be insufficient to lower reliability. As used herein, "equivalent" refers to "reaction equivalent", and for example, the acid anhydride equivalent of an acid anhydride is calculated assuming that 1 acid anhydride group reacts with 1 epoxy group; the equivalent of a phenol resin is calculated assuming that 1 phenolic hydroxyl group reacts with 1 epoxy group; and the equivalent of an aromatic amine is calculated assuming that 1 active hydrogen of an amino group reacts with 1 epoxy group.

The coupling agent (C) used in the present invention is not particularly limited, and conventionally known coupling agents can be used. Examples thereof include, for example, silane compounds having primary and/or secondary and/or tertiary amino groups, various silane compounds such as epoxysilane, mercaptosilane, alkylsilane, ureidosilane and vinylsilane, titanium compounds, aluminum chelates, and aluminum/zirconium compounds.

Examples of such compounds include silane-based coupling agents such as vinyltrichlorosilane, vinyltriethoxysilane, vinyltris(β-methoxyethoxy) silane, γ-methacryloxypropyltrimethoxysilane, β-(3,4-epoxycyclohexyl) ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl) aminopropyltrimethoxysilane, γ-(N,N-diethyl) aminopropyltrimethoxysilane, γ-(N,N-dibutyl) aminopropyltrimethoxysilane, γ-(N-methyl) anilinopropyltrimethoxysilane, γ-(N-ethyl) anilinopropyltrimethoxysilane, γ-(N,N-dimethyl) aminopropyltriethoxysilane, γ-(N,N-diethyl) aminopropyltriethoxysilane, γ-(N,N-dibutyl) aminopropyltriethoxysilane, γ-(N-ethyl) anilinopropyltriethoxysilane, γ-(N-ethyl) anilinopropyltriethoxysilane, γ-(N,N-dimethyl) aminopropylmethyldimethoxysilane, γ-(N,N-diethyl) aminopropylmethyldimethoxysilane, γ-(N,N-dibutyl) aminopropylmethyldimethoxysilane, γ-(N-methyl) anilinopropylmethyldimethoxysilane, γ-(N-ethyl) anilinopropylmethyldimethoxysilane, N-(trimethoxysilylpropyl) ethylenediamine, N-(dimethoxymethylsilylisopropyl) ethylenediamine, methyltrimethoxysilane, dimethyldimethoxysilane, methyltriethoxysilane, γ-chloropropyltrimethoxysilane, hexamethyldisilane, vinyltrimethoxysilane and γ-mercaptopropylmethyldimethoxysilane, and titanate-based coupling agents such as isopropyltriisostearoyl titanate, isopropyltris (dioctylpyrophosphate) titanate, isopropyltri (N-aminoethyl-aminoethyl) titanate, tetraoctylbis (ditridecylphosphite) titanate, tetra (2,2-diallyloxymethyl-1-butyl)bis(ditridecyl)phosphitetitanate, bis(dioctylpyrophosphate) oxyacetate titanate, bis (dioctylpyrophosphate) ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri (dioctylphosphate)titanate, isopropyltricumylphenyltitanate, and tetraisopropylbis (dioctylphosphite) titanate. They can be used singly or in combination thereof.

The total amount of the coupling agents compounded is preferably 0.037 to 5.0 mass %, more preferably 0.05 to 4.75 mass %, still more preferably 0.1 to 2.5 mass %, based on the liquid resin composition. When the total amount of the coupling agents is lower than 0.037 mass %, the adhesiveness between a substrate and a cured product of the liquid resin composition tends to be decreased, while when the total amount is higher than 5.0 mass %, physical properties such as glass transition temperature and bending strength tend to be decreased.

The liquid resin composition for electronic components according to the present invention is preferably compounded with aminorganic filler. The inorganic filler is not particularly limited as long as it is an inorganic filler generally used in liquid resin compositions for electronic components. Examples of such inorganic fillers include silica such as fused silica, crystalline silica and synthetic silica, calcium carbonate, talc, clay, alumina such as alumina oxide, powders of silicon nitride, silicon carbide, boron nitride, calcium silicate, potassium titanate, aluminum nitride, beryllia, zirconia, zircon, forsterite, steatite, spinel, mullite, and titania, which may be provided in the form of powder, ensphered beads, glass fiber and the like. Further, inorganic nanoparticles such as nano silica obtained by hydrolysis/condensation reaction of alkoxide compounds can be used as the filler. These inorganic fillers may be used alone or as a mixture of two or more thereof.

From the view point of formability such as fluidity, the inorganic filler is preferably in a spherical form or a form near to a sphere. The average particle size of the inorganic filler is preferably in the range of 5 nm to 10 μm. When the average particle size is greater than 10 μm, the filler tends to be easily precipitated, and the permeability, into minute gaps, of the liquid resin composition for electronic components and the fluidity thereof tend to be decreased to easily cause voids or failure in filling. These fillers may be treated with a coupling agent if necessary before use. The amount of the inorganic filler compounded is preferably 10% by mass or less, more preferably 5% by mass or less, based on the liquid resin composition for electronic components. Further, the amount of the inorganic filler compounded can also be 0% by mass.

When the amount is higher than 10% by mass, the difference in the linear coefficient of expansion between a cured product of the liquid resin composition for electronic components and a flexible circuit board using a film substrate is increased, thus causing them to be easily released from each other in the interface therebetween. When the amount of the inorganic filler is high, the viscosity of the liquid resin composition tends to be increased to increase the surface tension thereof, thus decreasing the fluidity.

The liquid resin composition for electronic components according to the present invention can if necessary use a curing accelerator for accelerating the reaction between the epoxy resin as the component (A) and the curing agent containing the component (B). For satisfying both curing properties and pot life, the curing accelerator is preferably a latent curing accelerator. The latent curing accelerator exhibits its curing accelerating function under a certain condition such as a specific temperature, and examples include latent curing accelerators wherein usual curing accelerator are protected with microcapsules etc. or have a structure of salts having various compounds added thereto. In this case, the latent curing accelerator, when placed at a specific temperature or more, release its curing accelerator from the microcapsule or the adduct.

Examples of the latent curing accelerator include core-shell particles wherein an amino group-containing compound in solid state at ordinary temperature is coated as a core with an epoxy compound as a shell in solid state at ordinary temperature, and commercial products such as Amicure (Registered Trademark) (manufactured by Ajinomoto Co., Inc.), and Novacure (Registered Trademark) (manufactured by Asahi Kasei Chemicals Corporation) wherein a microencapsulated amine is dispersed in a bisphenol A epoxy resin and bisphenol F epoxy resin can be used.

Salts of amine compounds or phosphorus compounds in the form of solid particles which are insoluble in liquid resin compositions for electronic components and are dissociated upon hot forming to exhibit their curing accelerating action, and compounds having intramolecular polarization, obtained by adding compounds having π bonds to the above compounds, can be used as the latent curing accelerator.

Examples of such latent curing accelerators include compounds having intramolecular polarization, obtained by adding compounds having π bonds to cycloamidine compounds such as 1,8-diaza-bicyclo (5,4,0) undecene-7, 1,5-diaza-bicyclo (4,3,0) nonene and 5,6-dibutylamino-1,8-diaza-bicyclo (5,4,0) undecene-7;

derivatives of tertiary amines, such as triethylene diamine, benzyldimethylamine, triethanolamine, dimethylaminoethanol, and tris(dimethylaminomethyl) phenol;

derivatives of imidazole compounds, such as 2-methylimidazole, 2-ethyl-4-methyl imidazole, 2-phenyl midazole, 2-phenyl-4-methyl imidazole, and 2-heptadecyl imidazole;

phosphorus compounds having intramolecular polarization, or derivatives thereof, obtained by adding compounds having π bonds such as maleicanhydride, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone and phenyl-1,4-benzoquinone, diazophenyl methane and phenol resin, to organic phosphine compounds such as tributyl phosphine, methyl diphenyl phosphine, triphenyl phosphine, diphenyl phosphine, and phenyl phosphine; and phenyl boron salts, and derivatives thereof, such as triphenylphosphine triphenyl boron, tetraphenylphosphonium tetraphenylborate, 2-ethyl-4-methylimidazole tetraphenylborate, and N-methylmorpholine tetraphenylborate. These latent curing accelerators may be used alone or as a mixture of two or more thereof.

Among those described above, the latent curing accelerator wherein a microencapsulated amine is dispersed in a bisphenol A epoxy resin and bisphenol F epoxy resin is preferable from the viewpoint of storage stability and rapid curing properties.

The amount of the curing accelerator compounded is not particularly limited insofar as the curing accelerating effect can be achieved. The total amount of the curing accelerators containing the non-latent curing accelerator is preferably 0.1 to 40% by mass, more preferably 1 to 20% by mass, based on the epoxy resin (A). When the amount is lower than 0.1 mass %, the resulting composition tends to be inferior in curing properties in a short time, while when the amount is higher than 40 mass %, the curing speed is too high thus making regulation difficult, and the resulting composition tends to be inferior in storage stability such as in pot life and shell life.

The liquid resin composition for electronic components according to the present invention can be compounded with a wide variety of known rubber particles in order to confer toughness and low elastic modulus on its cured epoxy resin material. As the rubber particles, those incompatible with an epoxy resin are effective in decreasing elastic modulus without decreasing the glass transition temperature (heat resistance) of the cured product. Specific examples include a butadiene/acrylonitrile/styrene copolymer, modified copolymers thereof obtained by adding an epoxy group, an amino group, a carboxyl group, a hydroxyl group etc. to the terminal or the side chain of the above copolymer, and modified silicone-based elastomers thereof obtained having an epoxy group, an amino group, a carboxyl group, a hydroxyl group etc. to the terminal or the side chain of the above copolymer. From the viewpoint of handleability and dispersibility in the resin component, the rubber particles are preferably those in the form of fine powder having previously finely dispersed in an epoxy resin or in a curing agent. The rubber particles are preferably those of a rubber-modified epoxy resin which is liquid at ordinary temperature because it can be uniformly mixed in the resin composition. By incorporating the rubber particles, the adhesiveness between a cured product of the liquid resin composition and a substrate or the like can be improved, and reliability such as resistance to high temperature/high humidity can be attained.

From the viewpoint of improving the migration resistance, humidity resistance and high-temperature resistance of semiconductor elements such as IC, anion-trapping agent can be contained if necessary in the liquid resin composition for electronic components according to the present invention. The ion-trapping agent is not particularly limited, and conventionally known ion-trapping agents can be used. Particularly, the ion-trapping agent is preferably a hydrotalcite represented by the following compositional formula (I) or a hydrate oxide of bismuth represented by the following formula (II).

(Formula 1)

$$Mg_{1-x}Al_x(OH)_2(CO_3)_{x/2} \cdot mH_2O \quad (I)$$

wherein $0 < x \leq 0.5$, and m is a positive number.
(Formula 2)

$$BiO_x(OH)_y(NO_3)_z \quad (II)$$

wherein $0.9 \leq x \leq 1.1$, $0.6 \leq y \leq 0.8$, and $0.2 \leq z \leq 0.4$.

The amount of the ion-trapping agent added is not particularly limited insofar as the ion-trapping agent is in an amount enough to trap anions such as halogen ions. From the viewpoint of migration resistance, the amount of the ion-trapping agent is preferably 0.1 to 3.0 mass %, more preferably 0.3 to 1.5 mass %, based on the liquid resin composition. The average particle size of the ion-trapping agent is preferably 0.1 to 3.0 μm, and the maximum particle size is preferably 10 μm or less. A compound of the formula (I) above is commercially available as DHT-4A (trade name) manufactured by Kyowa Chemical Industry Co., Ltd. A compound of the formula (II) above is commercially available as IXE500 (trade name) manufactured by Toagosei Co., Ltd. If necessary, another ion-trapping agent may be added. Examples include hydrate oxides of an element selected from magnesium, aluminum, titanium, zirconium, and antimony, and they can be used singly or in combination of two or more thereof.

If necessary, a silicone-modified epoxy resin can be added to the liquid resin composition for electronic components according to the present invention. By adding the silicone-modified epoxy resin, there is brought about an effect on the leveling properties, filet formability and void reduction of the liquid sealing material. The silicone-modified epoxy resin can be obtained as a reaction product between an organosiloxane having a functional group reacting with an epoxy group and an epoxy resin and is preferably in liquid state at ordinary temperature. The silicone-modified epoxy resin can be localized on the surface of a liquid, to reduce the surface tension of the liquid. The liquid can thereby have increased wetting properties to make the fluid easily fluidized and is thus endowed with an effect of improving permeability into narrow gaps and of reducing entrained voids.

Examples of the organosiloxane having a functional group reacting with an epoxy group include dimethylsiloxane, diphenylsiloxane and methylphenylsiloxane having, in one molecule, one or more amino groups, carboxyl groups, hydroxyl groups, phenolic hydroxyl groups, mercapto groups or the like. The weight-average molecular weight of the organosiloxane is preferably in the range of 500 to 5000. This is because when the molecular weight is lower than 500, the compatibility of the organosiloxane with a resin is so high that the effect thereof as an additive cannot be exhibited, while when the molecular weight is higher than 5000, the organosiloxane becomes incompatible with a resin, and thus the silicone-modified epoxy resin is separated and exuded upon forming, to deteriorate adhesiveness and appearance.

The epoxy resin for obtaining the silicone-modified epoxy resin is not particularly limited as long as it is compatible with the resin in the liquid resin composition for electronic components, and the epoxy resin used generally in liquid resin compositions for electronic components can be used. Examples thereof include glycidyl ether type epoxy resins obtained by reacting epichlorohydrin with bisphenol A, bisphenol F, bisphenol AD, bisphenols, naphthalene diol, hydrogenated bisphenol A; novolac type epoxy resins such as an ortho-cresol novolac type epoxy resin, wherein novolac resins obtain by condensing or co-condensing phenols with aldehydes were epoxylated; glycidyl ester type epoxy resins obtained by reacting polybasic acids such as phthalic acid and dimer acid with epichlorohydrin; glycidylamine type epoxy resins obtained by reacting polyamines such as diaminodiphenyl methane and isocyanuric acid with epichlorohydrin; and linear aliphatic epoxy resins and alicyclic epoxy resins obtained by oxidizing olefin bonds with peracids such as peracetic acid. These may be used alone or as a mixture of two or more thereof, which is preferably in liquid state at ordinary temperature.

The liquid resin composition for electronic components according to the present invention can be compounded if necessary with other additives, for example a dye, a colorant such as carbon black, titanium oxide or read lead, a flame retardant, a diluent, another leveling agent, another stress relaxation agent, a defoaming agent, an adhesion promoter etc.

As the flame retardant, a brominated epoxy resin and antimony trioxide can be used, but a halogen- and antimony-free flame retardant is preferably used. For example, red phosphorus, red phosphorus coated with a thermoplastic resin such a phenol resin, phosphorus compounds such as a phosphate and triphenyl phosphine oxide, nitrogen-containing compounds such as melamineamelamine derivative, a melamine-modified phenol resin, a compound having a triazine ring, a cyanuric acid derivative and an isocyanuric acid derivative, phosphorus- and nitrogen-containing compounds such as cyclophosphazene, metal complex compounds such as dicyclopentadienyl iron, zinc compounds such as zinc oxide, zinc stannate, zinc borate and zinc molybdate, metal oxides such as iron oxide and molybdenum oxide, metal hydroxides such as aluminum hydroxide and magnesium hydroxide, and composite metal hydroxides represented by the following compositional formula (III):
(Formula 3)

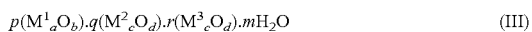

$$p(M^1{}_aO_b).q(M^2{}_cO_d).r(M^3{}_cO_d).mH_2O \quad (III)$$

wherein $M^1$, $M^2$ and $M^3$ represent metal elements different from one another, a, b, c, d, p, q and m each represent a positive number, and r represents 0 or a positive number.

$M^1$, $M^2$ and $M^3$ in the compositional formula (III) are not particularly limited insofar as they are metal elements different from one another. From the viewpoint of flame resistance, $M^1$ is preferably selected from the group consisting of metal elements belonging to the third period, alkaline earth metal elements of group IIA and metal elements belonging to groups IVB, IVB, VIII, IB, IIIA and IVA, and $M^2$ is preferably selected from transition metal elements of groups IIIB to IIB. The metal $M^1$ is more preferably selected from the group consisting of magnesium, calcium, aluminum, tin, titanium, iron, cobalt, nickel, copper and zinc, and $M^2$ is more preferably selected from the group consisting of iron, cobalt, nickel, copper and zinc. From the viewpoint of fluidity, $M^1$ is preferably magnesium, $M^2$ preferably zinc or nickel, and preferably r=0. The molar ratio of p, q and r is not particularly limited, but preferably r=0 and p/q is 1/99 to 1/1. The classification of the metal elements is based on the long form of the periodic table in which typical elements are to be in A subgroup and transition elements are to be in B subgroup. The flame retardants described above may be used singly or as a mixture of two or more thereof.

As the diluent, a reactive diluent having an epoxy group may be mixed for regulation of viscosity. The reactive diluent having an epoxy group includes, for example, n-butyl glycidyl ether, versatic acid glycidyl ether, styrene oxide, ethyl hexyl glycidyl ether, phenyl glycidyl ether, butylphenyl glycidyl ether, 1,6-hexanediol diglycidyl ether, neopentyl glycol diglycidyl ether, diethylene glycol diglycidyl ether, and trimethylol propane triglycidyl ether. These diluents may be used alone or as a mixture of two or more thereof.

The liquid resin composition for electronic components according to the present invention may be produced by any methods wherein the respective components described above can be uniformly dispersed and mixed with one another. Generally, the liquid resin composition can be obtained by weighing out the materials of predetermined amounts, mixing and kneading them by a mortar and pestle machine, a mixing roll, a planetary mixer or the like, and defoaming the mixture if necessary.

Electronic component devices obtained by sealing elements with the liquid resin composition for electronic components obtained in the present invention include electronic component devices which load elements such as active elements (for example, semiconductor chip, transistor, diode, and thyristor) and passive elements (for example, capacitor, resistance, resistant array, coil and switch) onto a supporting member (for example, lead frame, wired tape carrier, rigid and flexible circuit board, glass, and silicon wafer) whose necessary part (s) is sealed with the liquid resin composition for electronic components according to the present invention. Particularly, the liquid resin composition for electronic components according to the present invention is preferably used in sealing an electronic component device having an electronic component bump-bonded directly onto an interconnection substrate having a film as a base material. For example, the liquid resin composition is applied to a semiconductor device wherein a semiconductor element is subjected via bump connection to flip-chip bonding to a wiring formed on a rigid and flexible circuit board or on a glass. Specific examples include semiconductor devices such as flip chip BGA and COF (Chip on Film). Particularly, the liquid resin composition for electronic components obtained according to the present invention is preferable as an underfill material for COF excellent in migration resistance. The liquid resin composition of the present invention can also be effectively used for printed circuit boards.

The method of sealing an element with the liquid resin composition for electronic components according to the present invention includes a discharging method, a casting method, a printing method etc.

EXAMPLES

Hereinafter, the present invention is described in more detail by reference to the Examples, but the scope of the present invention is not limited to these examples.

Examples 1 to 7 and Comparative Examples 1 to 2

A bisphenol F liquid epoxy type resin having an epoxy equivalent of 160 (trade name: YDF-8170C, manufactured by Tohto Kasei Co., Ltd.) and a naphthalene epoxy resin having an epoxy equivalent of 140 (trade name: HP-4032, manufactured by Dainippon Ink And Chemicals, Incorporated) were used as the epoxy resin (A).

A cyclic acid anhydride in liquid state at ordinary temperature with an acid anhydride equivalent of 234 (trade name: jER Cure YH306, manufactured by Japan Epoxy Resins Co., Ltd.) was used as the cyclic acid anhydride (B), and a cyclic acid anhydride in liquid state at ordinary temperature with an acid anhydride equivalent of 166 (trade name: HN-2200, manufactured by Hitachi Chemical Co., Ltd.) was used as a comparative curing agent.

A curing accelerator wherein microencapsulated amine was dispersed in a bisphenol A epoxy resin and bisphenol F epoxy resin (trade name: Novacure HX-3921HP (curing accelerator 1) manufactured by Asahi Kasei Chemicals Corporation) and 2-ethyl-4-methylimidazole (trade name: 2E4MZ (curing accelerator 2) manufactured by Shikoku Chemicals Corporation) were used as the latent curing accelerator.

γ-Glycidoxypropyltrimethoxysilane (tradename: SilaAceS510, manufactured by Chisso Corporation) was used as the coupling agent (C), and spherical synthetic silica having a specific surface area of 1 m²/g and an average particle size of 4 μm was used as the filler.

A rubber-modified epoxy resin obtained by previously heating and kneading and then finely dispersing an acrylonitrile/butadiene/methacrylic acid/divinyl benzene copolymer (trade name: XER-91P, manufactured by JSR Co., Ltd.) in a bisphenol F liquid epoxy resin (YDF-8170C) in a mass ratio of 1/4 was used as the rubber particle component.

A silicone-modified epoxy resin obtained by heating, mixing and melting a phenol-modified silicone having a hydroxyl equivalent of 750 (trade name: BY16-799, manufactured by Dow Corning Toray Silicone Co., Ltd.) with a bisphenol F liquid epoxy resin (YDF-8170C) in a mass ratio of 1/1 was used as the leveling agent.

A bismuth type ion-trapping agent (trade name: IXE-500, manufactured by Toagosei Co., Ltd.) was used as the ion-trapping agent.

These components were mixed in mass parts shown in Table 1, then kneaded and dispersed by a mortar and pestle machine and defoamed under vacuum to prepare liquid resin compositions for electronic components in Examples 1 to 7 and Comparative Examples 1 to 2.

TABLE 1

| Component for blend | Example | | | | | | | Comparative Example | |
| --- | --- | --- | --- | --- | --- | --- | --- | --- | --- |
| | 1 | 2 | 3 | 4 | 5 | 6 | 7 | 1 | 2 |
| bisphenol F type epoxy resin | 80 | 40 | 80 | 80 | 80 | 40 | 80 | 80 | 40 |
| naphthalene type epoxy resin | 20 | 20 | 20 | 20 | 20 | 20 | 20 | 20 | 20 |
| rubber-modified epoxy resin | — | 50 | — | — | — | 50 | — | — | 50 |
| cyclic acid anhydride (acid anhydride equivalent 234) | 135 | 135 | 135 | 135 | 135 | 135 | 135 | — | — |
| cyclic acid anhydride (acid anhydride equivalent 166) | — | — | — | — | — | — | — | 96 | 96 |
| curing accelerator 1 | 20 | 20 | 20 | 20 | — | 20 | 20 | 20 | 20 |
| curing accelerator 2 | — | — | — | — | 1 | — | — | — | — |
| coupling agent | 1 | 1 | 1 | 1 | 1 | 1 | 1 | 1 | 1 |
| silicone-modified epoxy resin | — | — | 0.5 | — | — | 0.5 | — | — | 0.5 |
| ion-trapping agent | — | — | — | 3 | — | 3 | — | — | 3 |
| spherical synthetic silica | — | — | — | — | — | — | 28 | — | — |

(Unit: mass parts)

The liquid resin compositions for electronic components prepared in Examples 1 to 7 and Comparative Examples 1 to 2 were evaluated in the following tests. The evaluation results are shown in Table 2 below.

(1) Viscosity

The liquid resin compositions for electronic components in Examples 1 to 7 and Comparative Examples 1 to 2 were kept at 25±1° C. and rotated for 1 minute at 100 rpm with an EMD rotating viscometer (manufactured by Tokimec, Inc.), and their values indicated by a scale were multiplied by 0.0125 as the conversion factor and shown as their viscosity.

(2) Gelling Time 0.1 g of the liquid resin composition for electronic components was dropped on a hot plate at 150° C. and stirred with a spatula so as not to spread too broadly. The time having elapsed from when it was dropped till when the viscosity of the liquid resin composition was increased so that the resin composition can be raised with a spatula without webbing, was determined as gelling time.

(3) Contact Angle

The contact angle of the resin composition dropped at 25±1° C. to a glass was measured with a contact angle measuring instrument (manufactured by Kyowa Kaimen Kagaku Co., Ltd.).

(4) Water Absorption

The liquid resin composition for electronic components was cured under the conditions of 150° C. and 2 hours to prepare a test specimen of 50 mm×50 mm×1 mm. This test specimen was measured for the initial weight W1, then placed in a high-temperature high-humidity chamber at 85° C./85% for 100 hours, and then measured for the weight W2, and the water absorption was determined according to the following equation:

Water absorption=$\{(W2-W1)/W1\} \times 100(\%)$ (5) Adhesion Force

The liquid resin composition for electronic components was cured under the conditions of 150° C. for 2 hours on a polyimide film (trade name: Captone, manufactured by DuPont-Toray Co., LTD.) and then cut into strips of 10 mm in width. The peel strength when the polyimide film was peeled from this strip specimen upwards at an angle of 90° was determined as adhesion force with a tensile testing machine (manufactured by Shimadzu Corporation).

(6) Extract Properties

A cured product of the liquid resin composition for electronic components, which had been cured under the conditions of 150° C. and 2 hours, was finely pulverized with a pulverizer, and the resulting sample, 5 g, was placed together with 50 g purified water in an extraction container made of fluorine resin. This container was placed in a stainless steel pressure-resistant container, and in a sealed state, the sample was extracted for 20 hours in a thermostatic chamber at 100° C. The extract was filtered and then the concentration of Cl ion in the extract was measured.

(7) Percentage of Rise of Viscosity

The liquid resin composition for electronic components was placed in a sealed container and then introduced into a thermostatic chamber kept at 25±1° C. After a predetermined time, the viscosity was measured, and the percentage of rise of viscosity was determined relative to the initial viscosity in (1) above.

(8) Evaluation of Migration Resistance

A flexible circuit board (manufactured by Shindo Denshi Kogyo Co., Ltd.) wherein opposing comb-like electrodes had been formed from tin-plated copper wirings onto a polyimide film with wirings of 15 μm in width with a 15-μm gap between wirings was prepared, then the liquid resin composition for electronic components was applied by a discharging method onto an opposing electrode part of the flexible circuit board, and then the liquid resin composition was cured at 150° C. for 2 hours to give a test specimen. A direct current with a voltage of 60 V was applied to this test specimen at a high temperature of 120° C. under 85% high humidity, and the resistance was continuously measured, and it was judged that leakage occurred when the resistance became $10^6 \Omega$ or less. This measurement was carried out up to 100 hours, and the liquid resin composition for electronic components whose resistance did not become $10^6 \Omega$ or less was shown >100 h.

(9) Penetration

An SUS spacer of 20 μm in thickness was sandwiched between two glasses to form a flow pass of 5 mm in width. This flow pass was placed horizontally on a hot plate at 70° C., and then the liquid resin composition for electronic components was dropped thereon, and the time till the resin composition had penetrated by 20 mm into the gap was measured. The sample with a penetration time of less than 3 minutes was judged to be fair, while the sample with a time of 3 minutes or more was judged to be inferior.

into water is reduced, and as a result, the amount of Cl ions in examination of extract properties is reduced.

In comparison between Examples 1 and 2, the liquid resin composition for electronic components, containing rubber particles, has higher adhesion force than that of the composition not containing rubber particles. This is considered attributable to improvement of adhesiveness to the polyimide film by incorporation of rubber particles. By improving the adhesion force, improvement of reliability in a high-temperature high-humidity test and a temperature cycle test can be attained.

In comparison between Examples 1 and 3, the liquid resin composition for electronic components, containing a silicone-modified epoxy resin, has a lower contact angle. This is considered attributable to the fact that the silicone-modified epoxy resin is localized in the surface of a liquid to reduce the surface tension of the liquid. The low contact angle leads to increased wetting properties on a substrate to make fluidization easy, and is thus effective in improving permeability into a narrow gap and in reducing entrained voids. In comparison between Examples 1 and 4, the liquid resin composition for electronic components, containing an ion-trapping agent, shows a lower amount of Cl ions in examination of extract properties. This is considered attributable to the effect of the ion-trapping agent to trap Cl ions. By reducing the amount of Cl ions, migration in a high-temperature high-humidity bias test is improved.

In comparison between Examples 1 and 5, the liquid resin composition for electronic components, containing a microencapsulated amine-based latent catalyst, shows a lower percentage of rise of viscosity and a shorter gelling

TABLE 2

| Item of evaluation | unit | Example | | | | | | | Comparative Example | |
|---|---|---|---|---|---|---|---|---|---|---|
| | | 1 | 2 | 3 | 4 | 5 | 6 | 7 | 1 | 2 |
| Viscosity | Pa·s | 0.4 | 0.6 | 0.4 | 0.4 | 0.4 | 0.6 | 1.1 | 0.3 | 0.5 |
| Gelling time | min | 1.0 | 0.9 | 1.0 | 1.1 | 2.1 | 1.0 | 0.9 | 0.8 | 0.8 |
| Contact angle | ° | 25 | 28 | 18 | 26 | 23 | 21 | 32 | 35 | 37 |
| Water absorption | % | 0.7 | 0.7 | 0.7 | 0.7 | 0.7 | 0.7 | 0.6 | 1.1 | 1.1 |
| Adhesion force | N/m | 500 | >1000 | 550 | 500 | 450 | >1000 | 450 | 450 | >1000 |
| Extract Cl ion | ppm | 0.4 | 0.4 | 0.4 | 0.2 | 0.5 | 0.2 | 0.3 | 1.1 | 1.1 |
| Percentage of rise of viscosity 24 h | % | 12 | 14 | 13 | 13 | 25 | 12 | 15 | 32 | 35 |
| 48 h | | 26 | 29 | 27 | 26 | 55 | 26 | 32 | 61 | 65 |
| 72 h | | 48 | 55 | 49 | 47 | 87 | 46 | 59 | 95 | 98 |
| migration resistance | □ | >100 | >100 | >100 | >100 | >100 | >100 | >100 | 30-40 | 30-40 |
| Penetration | □ | fair | fair | fair | fair | fair | fair | fair | fair | fair |

It can be seen that the liquid resin compositions for electronic components in Examples 1 to 7, which were made use of a cyclic acid anhydride being liquid at ordinary temperature and having an acid anhydride equivalent of 234, are superior in migration resistance to the compositions in Comparative Examples 1 and 2 which were made use of a cyclic acid anhydride being liquid state at ordinary temperature and having an acid anhydride equivalent of 166. This is considered attributable to lower water absorption and a lower amount of Cl ions in examination of extract properties. That is, the density of ester groups in the cyclic acid anhydride having a higher acid anhydride equivalent is lower than in the cyclic acid anhydride having a lower acid anhydride equivalent, and thus its cured product is estimated to have a lower water absorption. Further, it is estimated that because the water absorption is low, the amount of ionic impurities eluted time. This is considered attributable to the fact that the microencapsulated amine-based latent catalyst is protected with the microcapsule at a low-temperature range of 40° C. or less and thus its catalyst function is extremely low, while at a high-temperature range of 120° C. or more, the microcapsule is rapidly melted to accelerate curing. Accordingly, the liquid resin composition for electronic components according to the present invention can be used for a long time at room temperature and simultaneously can reduce the curing time, and can thus be said to be a composition extremely excellent in workability.

The liquid resin composition for electronic components in Example 6, containing the rubber-modified epoxy resin, the silicone-modified epoxy resin, the ion-trapping agent, and the microencapsulated amine-based latent catalyst, can be said to be a composition exhibiting excellent properties in any of curing properties, water absorption property, adhesiveness, extract properties, pot life, migration resistance, and penetration, as compared with those of the resin compositions in Examples 1 to 5, 7 and Comparative Examples 1 to 2.

Industrial Applicability

The liquid resin composition for electronic components according to the present invention is a liquid resin composition for electronic components which is excellent in migration resistance and also superior in formability and reliability, and its industrial value is high. Particularly, the liquid resin composition of the present invention is useful as an underfill material for a semiconductor device wherein a semiconductor element is subjected via bump connection to flip-chip bonding to a wiring formed on a rigid and flexible circuit board or on a glass, specifically for a semiconductor device such as flip chip BGA and COF.

The invention claimed is:

1. A liquid resin composition for electronic components, which comprises (A) an epoxy resin, (B) a cyclic acid anhydride which is liquid at 25° C. and has an acid anhydride equivalent ((molecular weight of the acid anhydride)/(number of acid anhydride groups in the acid anhydride molecule)) of 200 or more, (C) a coupling agent, and (D) a silicone-modified epoxy resin, said silicone-modified epoxy resin (D) having been obtained as a reaction product between (i) an organosiloxane having a functional group reacting with an epoxy group and (ii) an epoxy group.

2. The liquid resin composition for electronic components according to claim 1, further comprising an inorganic filler, wherein the amount of the inorganic filler compounded is 10% by mass or less.

3. The liquid resin composition for electronic components according to claim 1, which further comprises rubber particles.

4. The liquid resin composition for electronic components according to claim 1, which further comprises an ion-trapping agent.

5. The liquid resin composition for electronic components according to any one of claims 1-3 and 4, which further comprises a latent curing accelerator for accelerating the reaction between (A) and (B).

6. The liquid resin composition for electronic components according to any one of claims 1-3 and 4, which is used for an electronic component device comprising an electronic component bump-bonded directly onto an interconnection substrate having a film as a base material.

7. An electronic component device sealed with the liquid resin composition for electronic components according to any one of claims 1-3 and 4.

8. The liquid resin composition for electronic components according to claim 1, which further comprises rubber particles and an ion trapping agent.

9. The liquid resin composition for electronic components according to claim 8, which further comprises a latent curing accelerator for accelerating the reaction between (A) and (B).

10. The liquid resin composition for electronic components according to claim 8, which is used for an electronic component device comprising an electronic component bump-bonded directly onto an interconnection substrate having a film as a base material.

11. An electronic component device sealed with the liquid resin composition for electronic components according to claim 8.

12. The liquid resin composition for electronic components according to claim 5, which is used for an electronic component device comprising an electronic component bump-bonded directly onto an interconnection substrate having a film as a base material.

13. An electronic component device sealed with the liquid resin composition for electronic components according to claim 5.

14. The liquid resin composition for electronic components according to claim 1, wherein said acid anhydride equivalent of said cyclic acid anhydride (B) is 200 to 400.

15. The liquid resin composition for electronic components according to claim 1, wherein said acid anhydride equivalent of said cyclic acid anhydride (B) is 200 to 300.

16. The liquid resin composition for electronic components according to claim 1, wherein said cyclic acid anhydride (B) is selected from the group consisting of trialkyl tetrahydrophthalic anhydride and dodecenyl succinic anhydride.

17. The liquid resin composition for electronic components according to claim 1, wherein said cyclic acid anhydride (B) contains no halogen atoms or ester linkages.

18. The liquid resin composition for electronic components according to claim 4, wherein said ion-trapping agent comprises a hydrotalcite represented by

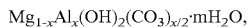

where $0<x\leqq 0.5$, and m is a positive number.

19. The liquid resin composition for electronic components according to claim 18, wherein an amount of the hydrotalcite is 0.1 to 3.0 mass % based on the liquid resin composition.

20. The liquid resin composition for electronic components according to claim 1, wherein said epoxy resin is a mixture of bisphenol F epoxy resin and naphthalene epoxy resin.

21. The liquid resin composition for electronic components according to claim 16, wherein said acid anhydride equivalent of said cyclic acid anhydride (B) is 200 to 400.

22. The liquid resin composition according to claim 16, wherein the weight-average molecular weight of the organosiloxane is in a range of 500 to 5,000.

23. The liquid resin composition according to claim 1, wherein the weight-average molecular weight of the organosiloxane is in a range of 500 to 5,000.

24. The liquid resin composition for electronic components according to claim 20, wherein said cyclic acid anhydride (B) is selected from the group consisting of trialkyl tetrahydrophthalic anhydride and dodecenyl succinic anhydride.

* * * * *